United States Patent
Barowski et al.

(10) Patent No.: US 8,427,833 B2
(45) Date of Patent: Apr. 23, 2013

(54) THERMAL POWER PLANE FOR INTEGRATED CIRCUITS

(75) Inventors: Harry Barowski, Boeblingen (DE); Thomas Brunschwiler, Thalwil (CH); Hubert Harrer, Schoenaich (DE); Andreas Huber, Leonberg (DE); Bruno Michel, Zurich (CH); Tim Niggemeier, Laatzen (DE); Stephan Paredes, Zurich (CH); Jochen Supper, Herrenberg (DE)

(73) Assignee: International Business Machines Corporation, Armonk, NY (US)

( * ) Notice: Subject to any disclaimer, the term of this patent is extended or adjusted under 35 U.S.C. 154(b) by 287 days.

(21) Appl. No.: 12/914,730

(22) Filed: Oct. 28, 2010

(65) Prior Publication Data

US 2012/0105145 A1    May 3, 2012

(51) Int. Cl.
*H05K 7/20*    (2006.01)
*H01L 25/00*    (2006.01)

(52) U.S. Cl.
USPC ........... 361/704; 361/711; 361/717; 257/713; 257/714; 257/691; 29/846; 29/592.1

(58) Field of Classification Search .......... 361/704, 361/711, 717; 257/713, 714, 796, 691, 685, 257/686, 698; 29/592.1, 846
See application file for complete search history.

(56) References Cited

U.S. PATENT DOCUMENTS

| | | | |
|---|---|---|---|
| 4,652,970 A * | 3/1987 | Watari et al. ........... | 361/699 |
| 4,766,481 A * | 8/1988 | Gobrecht et al. ........ | 257/664 |
| 5,128,831 A * | 7/1992 | Fox et al. ............... | 361/735 |
| 5,199,165 A | 4/1993 | Crawford et al. | |
| 5,579,207 A | 11/1996 | Hayden et al. | |
| 5,811,878 A * | 9/1998 | Harmoinen et al. ...... | 257/723 |
| 5,883,426 A * | 3/1999 | Tokuno et al. ........... | 257/686 |
| 5,978,220 A * | 11/1999 | Frey et al. .............. | 361/699 |
| 6,014,313 A | 1/2000 | Hesselbom | |
| 6,088,227 A | 7/2000 | Bujtas et al. | |
| 6,201,701 B1 * | 3/2001 | Linden et al. ........... | 361/720 |
| 6,215,681 B1 | 4/2001 | Schuurman et al. | |
| 6,282,095 B1 | 8/2001 | Houghton et al. | |
| 6,351,393 B1 | 2/2002 | Kresge et al. | |

(Continued)

OTHER PUBLICATIONS

International Search Report and Written Opinion dated Jan. 31, 2012 for International Application No. PCT/EP2011/068427, 12 pages.

(Continued)

*Primary Examiner* — Anatoly Vortman
(74) *Attorney, Agent, or Firm* — Francis Lammes; Stephen J. Walder, Jr.; Diana R. Gerhardt

(57) ABSTRACT

A mechanism is provided for a thermal power plane that delivers power and constitutes minimal thermal resistance. The mechanism comprises a processor layer coupled, via a first set of coupling devices, to a signaling and input/output (I/O) layer and a power delivery layer coupled, via a second set of coupling devices, to the processor layer. In the mechanism, the power delivery layer is dedicated to only delivering power and does not provide data communication signals to the elements of the mechanism. In the mechanism, the power delivery layer comprises a plurality of conductors, a plurality of insulating materials, one or more ground planes, and a plurality of through laminate vias. In the mechanism, the signaling and input/output (I/O) layer is dedicated to only transmitting the data communication signals to and receiving the data communications signals from the processor layer and does not provide power to the elements of the processor layer.

24 Claims, 6 Drawing Sheets

U.S. PATENT DOCUMENTS

| | | | |
|---|---|---|---|
| 6,611,057 | B2 | 8/2003 | Mikubo et al. |
| 6,800,936 | B2 * | 10/2004 | Kosemura et al. ............ 257/748 |
| 6,994,151 | B2 * | 2/2006 | Zhou et al. ................... 165/80.4 |
| 7,005,586 | B1 | 2/2006 | Duley |
| 7,012,414 | B1 | 3/2006 | Mehrotra et al. |
| 7,135,766 | B1 | 11/2006 | Costa et al. |
| 7,355,273 | B2 | 4/2008 | Jackson et al. |
| 7,394,659 | B2 * | 7/2008 | Colgan et al. .................. 361/718 |
| 7,435,620 | B2 | 10/2008 | Benson et al. |
| 7,589,008 | B2 | 9/2009 | Kirby |
| 7,592,697 | B2 | 9/2009 | Arana et al. |
| 7,663,246 | B2 | 2/2010 | Chen et al. |
| 7,672,132 | B2 * | 3/2010 | Fitzgerald et al. ............. 361/702 |
| 7,791,889 | B2 * | 9/2010 | Belady et al. ................. 361/721 |
| 7,898,078 | B1 * | 3/2011 | Bernstein et al. ............. 257/712 |
| 8,018,047 | B2 * | 9/2011 | Bayerer et al. ................ 257/700 |
| 8,089,777 | B2 * | 1/2012 | Negishi ......................... 361/783 |
| 8,111,515 | B2 * | 2/2012 | Akram et al. ................. 361/718 |
| 8,253,234 | B2 * | 8/2012 | Barowski et al. ............. 257/691 |
| 2001/0045644 | A1 * | 11/2001 | Huang .......................... 257/718 |
| 2002/0020862 | A1 | 2/2002 | Livengood et al. |
| 2002/0131256 | A1 | 9/2002 | Smith et al. |
| 2003/0081389 | A1 | 5/2003 | Nair et al. |
| 2003/0150641 | A1 * | 8/2003 | Kinayman et al. ............ 174/255 |
| 2003/0168729 | A1 * | 9/2003 | Ishiwata et al. ............... 257/700 |
| 2004/0124004 | A1 | 7/2004 | Nair et al. |
| 2005/0263879 | A1 * | 12/2005 | Michel et al. ................. 257/706 |
| 2006/0071648 | A1 * | 4/2006 | Narendra et al. ............. 323/202 |
| 2006/0102997 | A1 * | 5/2006 | Bang et al. .................... 257/686 |
| 2008/0023731 | A1 * | 1/2008 | Bernstein et al. ............. 257/278 |
| 2008/0030961 | A1 | 2/2008 | Koo et al. |
| 2008/0032446 | A1 | 2/2008 | Wood et al. |
| 2008/0116557 | A1 | 5/2008 | Paek et al. |
| 2008/0277778 | A1 | 11/2008 | Furman et al. |
| 2008/0303163 | A1 | 12/2008 | Liu et al. |
| 2009/0039498 | A1 * | 2/2009 | Bayerer ........................ 257/700 |
| 2009/0057867 | A1 | 3/2009 | Hool |
| 2009/0108435 | A1 | 4/2009 | Bernstein et al. |
| 2009/0196086 | A1 * | 8/2009 | Pelley et al. .................... 365/63 |
| 2009/0251862 | A1 | 10/2009 | Knickerbocker et al. |
| 2009/0273083 | A1 | 11/2009 | Sauciuc et al. |
| 2009/0308578 | A1 | 12/2009 | Bernstein et al. |
| 2009/0311826 | A1 | 12/2009 | Bernstein et al. |
| 2010/0013073 | A1 | 1/2010 | Andry et al. |
| 2010/0047967 | A1 | 2/2010 | Lim et al. |
| 2010/0109096 | A1 | 5/2010 | Osada et al. |
| 2012/0105144 | A1 * | 5/2012 | Barowski et al. ............. 327/565 |
| 2012/0106074 | A1 * | 5/2012 | Barowski et al. ........ 361/679.54 |
| 2012/0147559 | A1 * | 6/2012 | Barowski et al. ............. 361/689 |
| 2012/0189243 | A1 * | 7/2012 | Barowski et al. ............... 385/14 |

OTHER PUBLICATIONS

International Search Report and Written Opinion dated Mar. 1, 2012 for International Application No. PCT/EP2011/068426, 11 pages.

International Search Report and Written Opinion dated Apr. 18, 2012 for International Application No. PCT/EP2011/068424, 12 pages.

Notice of Allowance mailed Apr. 23, 2012 for U.S. Appl. No. 12/914,644; 12 pages.

Response to Restriction Requirement filed with the USPTO on Feb. 21, 2012 for U.S. Appl. No. 12/914,644; 6 pages.

Restriction Requirement mailed Feb. 7, 2012 for U.S. Appl. No. 12/914,644; 6 pages.

U.S. Appl. No. 12/914,644.

U.S. Appl. No. 12/914,697.

"3D Integration Breakthrough—ALLVIA Integrates Embedded Capacitors for Silicon Interposers and 3D Stacked Semiconductors", http://www.allvia.com/news/1002_integration_breakthrough.html, downloaded from the Internet Apr. 27, 2010, 2 pages.

"The International Technology Roadmap for Semiconductors 2009 Edition Test and Test Equipment", http://www.itrs.net/links/2009ITRS/2009Chapters_2009Tables/2009_Test.pdf, 2009 Edition, 53 pages.

"The Next Step in Assembly and Packaging: System Level Integration in the Package (SiP)", SiP White Paper V9.0, http://www.itrs.net/links/2007itrs/LinkedFiles/AP/AP_Paper.pdf, printed on Jan. 7, 2011, 127 pages.

"Through Silicon Via Technology: The Ultimate Market for 3D Interconnect", http://www.techsearchinc.com/pdfs/TSV_WEB.pdf, TechSearch International, Jan. 2008, 2 pages.

"Waytronx 3C for 3D Packaging Roadmap", White Paper, Waytronx, Inc., 2007, 11 pages.

Bakir, Muhannad S. et al., "3D Heterogeneous Integrated Systems: Liquid Cooling, Power Delivery, and Implementations", IEEE 2008, pp. 663-670.

Bakir, Muhannad S. et al., "3D Integrated Circuits: Liquid Cooling and Power Delivery", IETE Technical Review, vol. 26, Issue 6, Nov.-Dec. 2009, pp. 407-416.

Bakir, Muhannad S. et al., "Integrated Interconnect Technologies for 3D Nanoelectronic Systems", Artech House, 2009, http://www.artechhouse.com/GetBlob.aspx?strName=bakir_246_CH07.pdf, 34 pages.

Bakir, Muhannad, "Power Delivery, Signaling and Cooling in 3D Integrated Systems", Symposium F: Packaging, Chip-Package Interactions, and Solder Materials Challenges, http://www.mrs.org/s_mrs/doc.asp?CID=18368&DID=234821, p. 15, Apr. 15-17, 2009, 18 pages.

Emma, P. G. et al., "Is 3D chip technology the next growth engine for performance improvement?", IBM J. Res. & Dev., vol. 52, No. 6, Nov. 2008, 12 pages.

Gerke, David, "NASA 2009 Body of Knowledge (BoK): Through-Silicon Via Technology", JPL Publication 09-28, Nov. 2009, 40 pages.

Gutmann, R.J. et al., "Smart Power Delivery using CMOS IC Technology: Promises and Needs", CMOSET '08, Aug. 4, 2008, http://www.cmoset.com/uploads/3.3-08.pdf, 27 pages.

Hoe, Y.Y. G. et al., "Effect of TSV Interposer on the Thermal Performance of FCBGA Package", Electronics Packaging Technology Conference, 2009, EPTC'09, 11th, Dec. 9-11, 2009, pp. 778-786.

Jain, Pulkit et al., "A Multi-Story Power Delivery Technique for 3D Integrated Circuits", ISLPED '08, Aug. 11-13, 2008, pp. 57-62.

Jain, Pulkit et al., "Thermal and Power Delivery Challenges in 3D ICs", Three-Dimensional Integrated Circuit Design, 2010, http://www.springerlink.com/content/kw67703t83802402/, Chapter 3, p. 33.

Khan, Navas et al., "Development of 3-D Stack Package Using Silicon Interposer for High-Power Application", IEEE Transactions on Advanced Packaging, vol. 31, No. 1, 2008, pp. 44-50.

King, Jr., Calvin R. et al., "3D Stacking of Chips with Electrical and Microfluidic I/O Interconnects", IEEE, 2008 Electronic Components and Technology Conference, pp. 1-7.

Kukowski, Rob, "MDT—Micro Deformation Technology", IMECE 2003, 2003 ASME International Mechanical Engineering Congress and RD&D Expo, Nov. 15-21, pp. 1-4.

Lee, Young-Joon et al., "Co-Optimization of Signal, Power, and Thermal Distribution Networks for 3D ICs", IEEE 2008, 2008 Electrical Design of Advanced Packaging and Systems Symposium, http://www.gtcad.gatech.edu/www/papers/edaps08.pdf, pp. 163-166.

Mach, M et al., "Thermal Design Considerations on Wire-Bond Packages", IEEE, Microelectronics and Packaging Conference, 2009, EMPC 2009, Jun. 15-18, 2009, 1 page.

Mounier, Eric, "Market Trends for 3D Stacking", The Global Assembly Journal for SMT and Advanced Packaging Professionals, vol. 7, No. 7, Jul. 2007, 56 pages.

Pavlidis, Vasilis F. et al., "Power Distribution Paths in 3-D ICs", GLSVLSI '09, May 10-12, 2009, pp. 263-268.

Schulz-Harder, Dr. Juergen, "Direct Copper Bonded Substrates for Semiconductor Power Devices", http://www.electrovac.com/servlet/com.itmr.waw.servlet.FileViewer?dokmanid=231290& kdid=160108&sprachid=1, printed Sep. 30, 2010, 6 pages.

Yu, Aibin et al., "Fabrication of Silicon Carriers with TSV Electrical Interconnections and Embedded Thermal Solutions for High Power 3-D Package", IEEE, 2008 Electronic Components and Technology Conference, pp. 24-28.

Kohl, Paul A. et al., "Symposium F: Packaging, Chip-Package Interactions, and Solder Materials Challenges", http://www.mrs.org/s_mrs/doc.asp?CID=18368&DID=234821&css=print, Apr. 15-17, 2009, printed on Apr. 26, 2010, 17 pages.

Notice of Allowance mailed Oct. 1, 2012 for U.S. Appl. No. 12/914,697; 16 pages.

U.S. Appl. No. 13/555,451.

\* cited by examiner

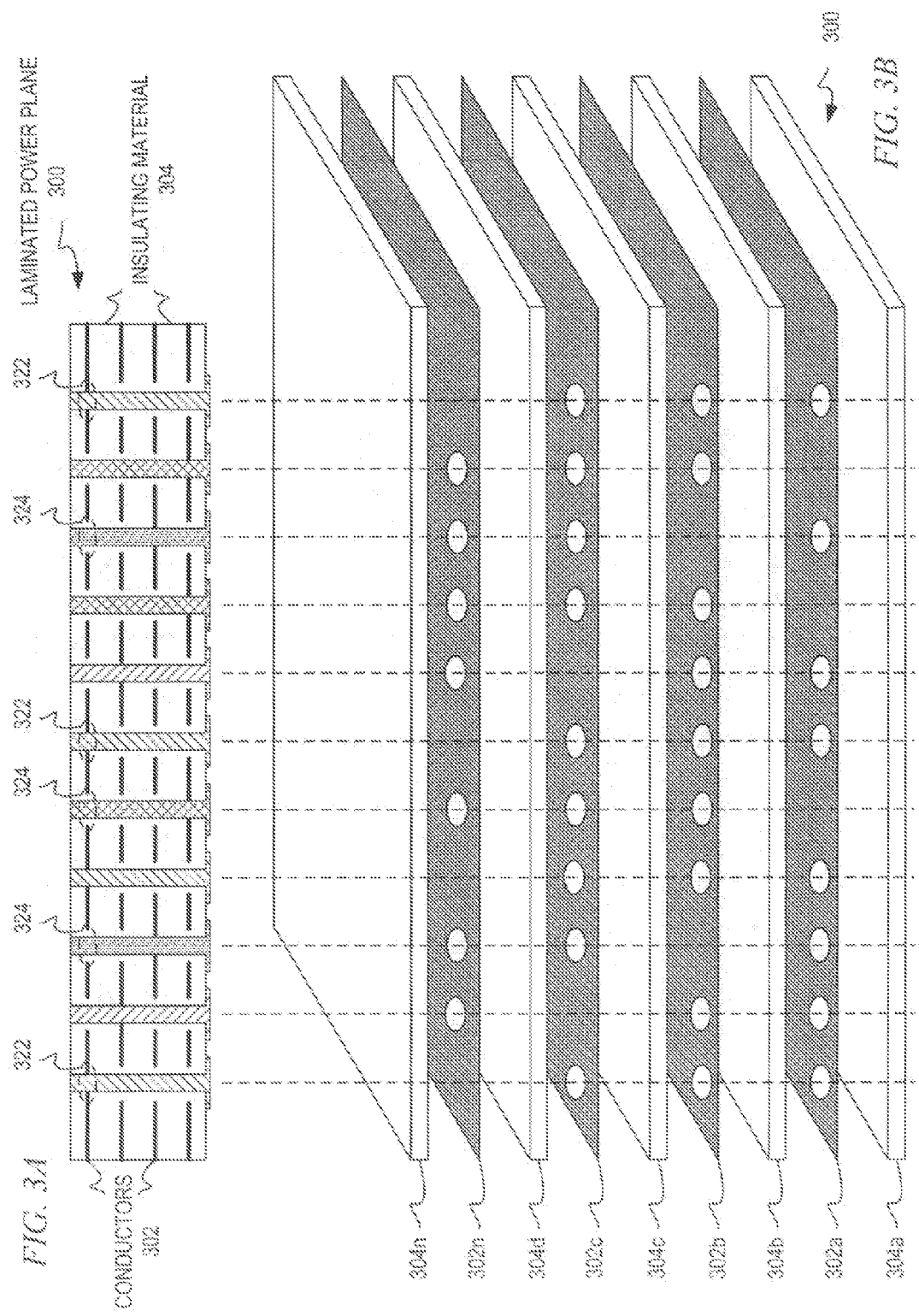

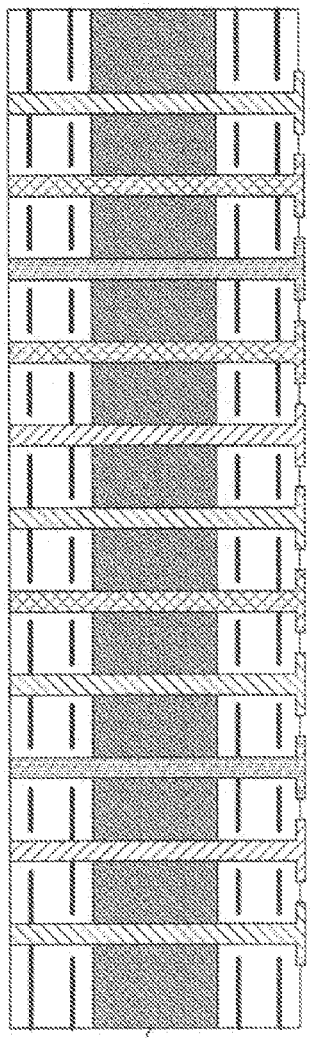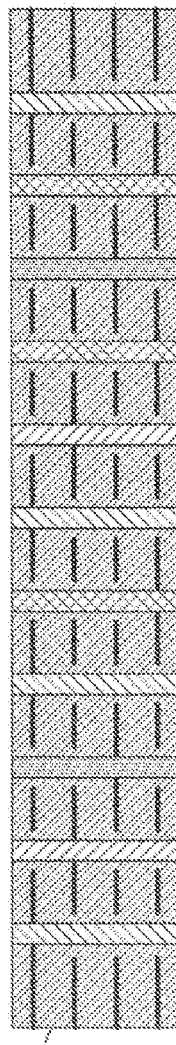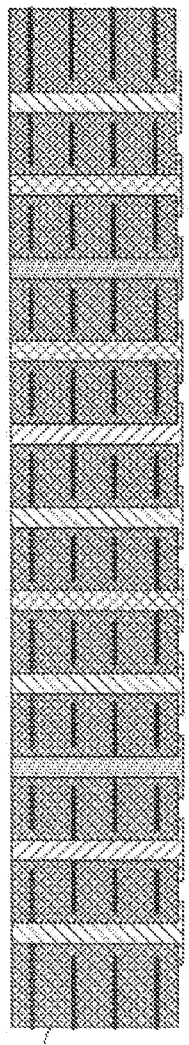

THERMAL POWER PLANE FOR INTEGRATED CIRCUITS

BACKGROUND

The present application relates generally to an improved data processing apparatus and method and more specifically to mechanisms for a thermal power plane that delivers power to integrated circuits and constitutes a minimal thermal resistance.

Three-dimensional (3D) integration provides performance improvements for microprocessor architectures through the increased interconnectivity between tiers within the chip stack. However, the electrical off-stack connectivity (signals and power) is still implemented on only one surface of the chip stack and does not scale with the number of tiers. With further scaling of complementary metal-oxide-semiconductor (CMOS) transistors the number of C4s will not be sufficient even for single dies, due to the slow reduction in C4 pitch over time. For 3D chip stacks, this results in sever design constraints and reduces the performance gain possible from vertical integration.

SUMMARY

In one embodiment, a three-dimensional (3D) very-large-scale integration (VLSI) device is provided. The 3D VLSI device comprises a processor layer coupled, via a first set of coupling devices, to at least one signaling and input/output (I/O) layer. The 3D VLSI device further comprises a power delivery layer coupled, via a second set of coupling devices, to the processor layer. In the 3D VLSI device, the power delivery layer is dedicated to only delivering power and does not provide data communication signals to the elements of the three-dimensional VLSI device. In the 3D VLSI device, the power delivery layer comprises a plurality of conductors, a plurality of insulating materials, one or more ground planes, and a plurality of through laminate vias (TLVs). In the 3D VLSI device, each TLV in the plurality of TLVs is coupled to one of the plurality of conductors or the one or more ground planes while not being coupled to other ones of the plurality of TLVs. In the 3D VLSI device, the at least one signaling and input/output (I/O) layer is dedicated to only transmitting the data communication signals to and receiving the data communications signals from the processor layer and does not provide power to the elements of the processor layer.

In another illustrative embodiment, a data processing system is provided. The data processing system comprising a processor layer coupled, via a first set of coupling devices, to at least one signaling and input/output (I/O) layer. The data processing system further comprises a power delivery layer coupled, via a second set of coupling devices, to the processor layer. In the data processing system, the power delivery layer is dedicated to only delivering power and does not provide data communication signals to the elements of the three-dimensional VLSI device. In the data processing system, the power delivery layer comprises a plurality of conductors, a plurality of insulating materials, one or more ground planes, and a plurality of through laminate vias (TLVs). In data processing system, each TLV in the plurality of TLVs is coupled to one of the plurality of conductors or the one or more ground planes while not being coupled to other ones of the plurality of TLVs. In the data processing system, the at least one signaling and input/output (I/O) layer is dedicated to only transmitting the data communication signals to and receiving the data communications signals from the processor layer and does not provide power to the elements of the processor layer.

In yet another illustrative embodiment, a method, in a data processing system, is provided for a thermal power plane that delivers power to integrated circuits and constitutes a minimal thermal resistance in a three-dimensional very-large-scale integration (VLSI) device. The illustrative embodiment couples a processor layer to at least one signaling and input/output (I/O) layer using a first set of coupling devices. The illustrative embodiment couples a power delivery layer to the processor layer using a second set of coupling devices. In the illustrative embodiment, the power delivery layer is dedicated to only delivering power and does not provide data communication signals to the elements of the three-dimensional VLSI device. In the illustrative embodiment, the power delivery layer comprises a plurality of conductors, a plurality of insulating materials, one or more ground planes, and a plurality of through laminate vias (TLVs). In the illustrative embodiment, each TLV in the plurality of TLVs is coupled to one of the plurality of conductors or the one or more ground planes while not being coupled to other ones of the plurality of TLVs. In the illustrative embodiment, the at least one signaling and input/output (I/O) layer is dedicated to only transmitting the data communication signals to and receiving the data communications signals from the processor layer and does not provide power to the elements of the processor layer.

These and other features and advantages of the present invention will be described in, or will become apparent to those of ordinary skill in the art in view of the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIGS. 3A-3G depict an example of a power delivery system implementation in accordance with an illustrative embodiment.

DETAILED DESCRIPTION

One illustrative embodiment provides a mechanism for optimizing semiconductor packing in a three-dimensional (3D) stack by dedicating one side of the 3D to power delivery and the other side of the 3D stack to high speed signaling delivery. Power delivery and high speed signal issues for the 3D stack are then solved by use of through silicon vias (TSVs). In another illustrative embodiment, delivery of multiple power voltages required by a 3D stack are provided via a laminate structure between the top of a 3D chip stack and a heat dissipation device, such as a heat sink, a cold plate, or the like, that provides power delivery for multiple power domains to the various integrated circuits of the 3D stack and obstructs the heat conduction only minimally.

Figure 1:
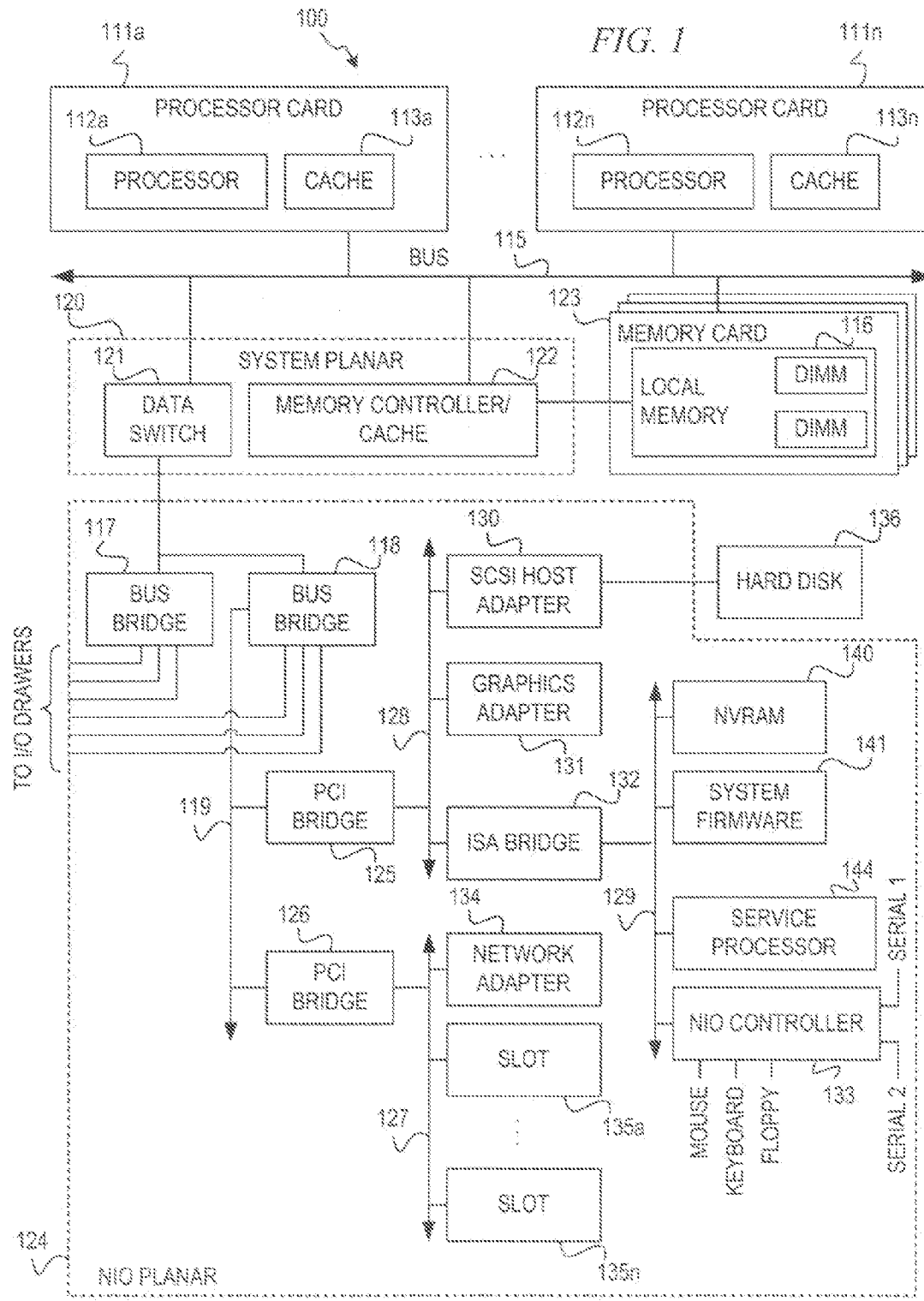
FIG. 1 depicts a block diagram of a data processing system with which aspects of the illustrative embodiments may advantageously be utilized.

Thus, the illustrative embodiments may be utilized in many different types of data processing environments including a distributed data processing environment, a single data processing device, or the like. In order to provide a context for the description of the specific elements and functionality of the illustrative embodiments, FIG. 1 is provided hereafter as example environments in which aspects of the illustrative embodiments may be implemented. While the description following FIG. 1 will focus primarily on a single data processing device implementation for a three-dimensional processor core architecture that provides performance improvement through an increased interconnectivity and higher packaging density, this is only an example and is not intended to state or imply any limitation with regard to the features of the present invention. To the contrary, the illustrative embodiments are intended to include distributed data processing environments and embodiments in which performance improvement through an increased interconnectivity and higher packaging density may be provided for a three-dimensional processor core architecture.

Referring now to the drawings and in particular to FIG. 1, there is depicted a block diagram of a data processing system with which aspects of the illustrative embodiments may advantageously be utilized. As shown, data processing system 100 includes processor units 111a-111n. Each of processor units 111a-111n includes a processor and a cache memory. For example, processor card 111a contains processor 112a and cache memory 113a, and processor card 111n contains processor 112n and cache memory 113n.

Processor units 111a-111n are connected to main bus 115. Main bus 115 supports a system planar 120 that contains processor units 111a-111n and memory cards 123. The system planar also contains data switch 121 and memory controller/cache 122. Memory controller/cache 122 supports memory cards 123 that include local memory 116 having multiple dual in-line memory modules (DIMMs).

Data switch 121 connects to bus bridge 117 and bus bridge 118 located within a native I/O (NIO) planar 124. As shown, bus bridge 118 connects to peripheral components interconnect (PCI) bridges 125 and 126 via system bus 119. PCI bridge 125 connects to a variety of I/O devices via PCI bus 128. As shown, hard disk 136 may be connected to PCI bus 128 via small computer system interface (SCSI) host adapter 130. A graphics adapter 131 may be directly or indirectly connected to PCI bus 128. PCI bridge 126 provides connections for external data streams through network adapter 134 and adapter card slots 135a-135n via PCI bus 127.

An industry standard architecture (ISA) bus 129 connects to PCI bus 128 via ISA bridge 132. ISA bridge 132 provides interconnection capabilities through NIO controller 133 having serial connections Serial 1 and Serial 2. A floppy drive connection, keyboard connection, and mouse connection are provided by NIO controller 133 to allow data processing system 100 to accept data input from a user via a corresponding input device. In addition, non-volatile RAM (NVRAM) 140, connected to ISA bus 129, provides a non-volatile memory for preserving certain types of data from system disruptions or system failures, such as power supply problems. A system firmware 141 is also connected to ISA bus 129 for implementing the initial Basic Input/Output System (BIOS) functions. A service processor 144 connects to ISA bus 129 to provide functionality for system diagnostics or system servicing.

The operating system (OS) is stored on hard disk 136, which may also provide storage for additional application software for execution by data processing system. NVRAM 140 is used to store system variables and error information for field replaceable unit (FRU) isolation. During system startup, the bootstrap program loads the operating system and initiates execution of the operating system. To load the operating system, the bootstrap program first locates an operating system kernel type from hard disk 136, loads the OS into memory, and jumps to an initial address provided by the operating system kernel. Typically, the operating system is loaded into random-access memory (RAM) within the data processing system. Once loaded and initialized, the operating system controls the execution of programs and may provide services such as resource allocation, scheduling, input/output control, and data management.

The illustrative embodiment may be embodied in a variety of data processing systems utilizing a number of different hardware configurations and software such as bootstrap programs and operating systems. The data processing system 100 may be, for example, a stand-alone system or part of a network such as a local-area network (LAN) or a wide-area network (WAN).

In known three-dimensional (3D) very-large-scale integration (VLSI) architectures, power delivery is mixed with high-speed signaling via C4 solder balls or pins to the 3D VLSI chip stack. However, the possible number of C4 pins which may be implemented limits that maximal input/output (I/O) bandwidth and power delivery. To distribute the power across the chip stack with minimal voltage drop, C4's on a 151 µm pitch are needed. Hence, only very few C4's may be used for signaling in the case of the limit of 44 C4's per square millimeter, constraining the communication bandwidth. Furthermore, by mixing the power delivery with the high-speed signaling on one side of the 3D VLSI chip stack as is currently done in known prior art, the thermal path is minimized from the junction to the cooling device due to the full access of the heat dissipation device on the opposed chip stack surface whether the heat dissipation device is air or liquid cooled. Similar mixing of power delivery with high-speed signaling via C4 solder balls or pins is also implemented in two-dimensional VLSI architectures. Thus, while the below description is directed to 3D VLSI architectures, the illustrative embodiments may also be implemented for other dimensional VLSI architectures without departing from the spirit and scope of the invention.

Figure 2:
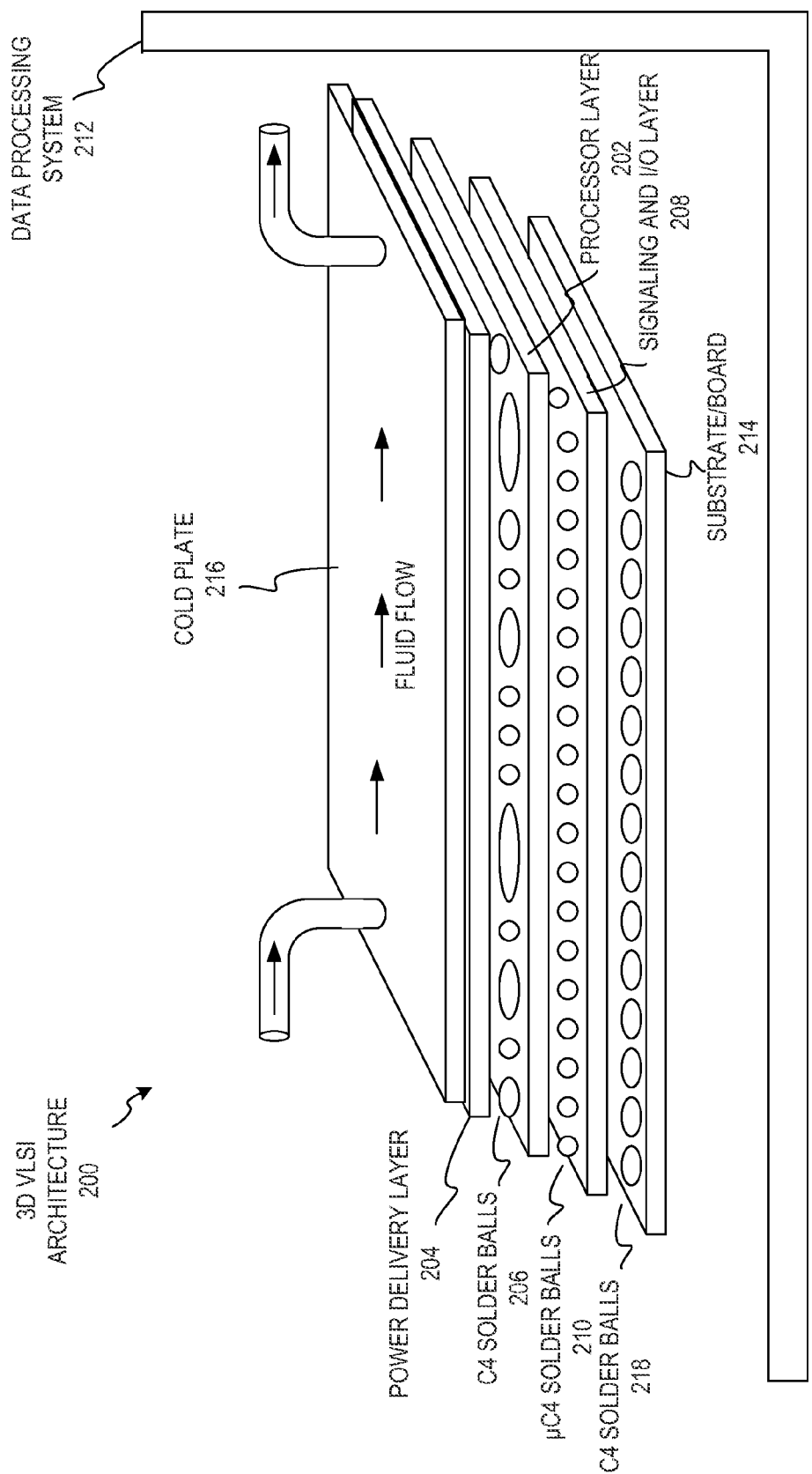
FIG. 2 depicts one example of a three-dimensional (3D) very-large-scale integration (VLSI) architecture in accordance with an illustrative embodiment.

FIG. 2 depicts one example of a three-dimensional (3D) very-large-scale integration (VLSI) architecture in accordance with an illustrative embodiment. In order to increase power delivery to support future complementary metal-oxide semiconductor (CMOS) technologies, 3D VLSI architecture 200 comprises high-performance high-power processor layer 202 comprising a plurality of processor cores. Power delivery layer 204 delivers power (Vdd) and ground from data processing system 212 to high-performance high-power processor layer 202 via a first plurality of C4 solder balls 206 that are optimized by size and/or geometry to deliver the required power to each of the plurality of processor cores. While the illustrative embodiments use C4 solder balls, other types of coupling, such as copper pillars, may be used without departing from the spirit and scope of the invention. Possible implementations of power delivery layer 204 will be discussed in detail below. Power delivery layer 204 may be coupled to data processing system 212 using any type of coupling mechanism, such as connectors formed on a system board, cabling to a power supply, or the like. Using power delivery layer 204 to provide power via one side of 3D VLSI architecture 200 increases the number of C4 pins, as opposed to known systems, and increases the power delivery above the current limit of 100 watts per square centimeter. Additionally, providing power via one side of 3D VLSI architecture 200 decreases power noise that is currently experienced on signal paths when mixed with power on the same side of a 3D VLSI stack. Furthermore, TSVs needed to deliver the power to processor layer 202 through substrate/board 214 and signaling and input/output (I/O) layer 208 may be removed due to the direct power delivery from power delivery layer 204. Providing power from one side saves active silicon area and does not cause macro redesigns due to protruding TSVs, especially for large size memory blocks. Any heat produced by power delivery layer 204 may be dissipated by cold plate 216 and a heat exchanger (not shown) which circulate a cooled liquid. The thermal coupling between power delivery layer 204 and cold plate 216 may be performed in general with thermal interface materials (typically particle filled polymers), such as thermal grease, thermal adhesive, thermal pads, or by soldering or fusion bonding. While the illustrative embodiments depict a cold plate, any type of heat dissipation device may be used without departing from the spirit and scope of the invention.

3D VLSI architecture 200 also comprises high-speed signaling and I/O layer 208 that comprises a plurality of high-speed signaling devices, which may include memory, switches, memory storage controller, or the like. In order to provide power to the high-speed signaling devices of high-speed signaling and I/O layer 208, 3D VLSI architecture 200 provides micro C4 (μC4) layer 210. Power passes from power delivery layer 204 through C4 solder balls 206, through processor layer 202 via through silicon vias (TSVs) within the silicon die of the processor layer, through μC4 layer 210, to high-speed signaling and I/O layer 208. A contact pad on one side of a die of processor layer 202 provides a connection of one or more C4 solder ball in C4 solder balls 206 to a TSV in processor layer 202, which passes power through processor layer 202 to a contact pad on the other side of the processor layer 202. The contact pad on the other side of processor layer 202 provides a connection of each TSV to a μC4 solder ball in μC4 layer 210. The use of micro μC4s in μC4 layer 210 allows higher interconnection density between processor layer 202 and high-speed signaling and I/O layer 208. Power may further pass from the μC4 layer 210 to one side of high-speed signaling and I/O layer 208. A contact pad on the side of high-speed signaling and I/O layer 208 provides a connection of one or more μC4 in μC4 layer 210 to a TSV in high-speed signaling and I/O layer 208, which passes power through high-speed signaling and I/O layer 208 to a contact pad on the other side of high-speed signaling and I/O layer 208. While only one high-speed signaling and I/O layer 208 is depicted, the illustrative embodiments recognize that any number of high-speed signaling and I/O layers may be implemented and connected via additional layers of C4 solder balls and TSVs.

Not only does μC4 layer 210 provide power to high-speed signaling and I/O layer 208, but μC4 layer 210 also provides connectivity for signaling between high-performance high-power processor layer 202 and high-speed signaling and layer 208 in a reverse fashion similar to the above description for power delivery from one layer to another layer. In order for high-speed signaling and I/0 layer 208 to transmit and receive signals with data processing system 212, high-speed signaling and I/0 layer 208 is coupled to substrate/board 214 of data processing system 212 via a second plurality of C4 solder balls 218. In addition to providing connectivity for high-speed signaling and I/O, the second plurality of C4 solder balls 218 may also provide connectivity for ground as well as any low-power requirements that may not be provided by power delivery layer 204 via μC4 layer 210. Thus, high-speed signaling and I/0 layer 208 comprises C4 pins for signals mixed with ground pins for shielding, power delivery, reference ground. and optional power for low(er) power chips.

Therfore, 3D VLSI architecture 200 provides for dedicated I/O for signal/ground via one side of the 3D stack and voltage/ground via an opposite side of the 3D stack. For connectivity to both high-performance high-power processor layer 202 and high-speed signaling and I/O layer 208, the illustrative embodiments provide different dedicated technologies, such as C4s, μC4s, or macroC4s in different geometrics and pitches. Power delivery system 204 may provide power via power pads or power strips, while inductive, capacitive, or optical signal may be established via substrate/board 214 to high-speed signaling and I/O layer 208. The more flexible and granular arrangement of power pins for different power domains of high-performance high-power processor layer 202 decreases the restrictions associated with mixing signaling and I/O with power. That is, the different C4s pitch and geometries associated with a first plurality of C4 solder balls 206 precisely mimic power domains of processing units/processing cores of high-performance high-power processor layer 202. Furthermore, by not mixing power with signaling and I/O the inductances in power delivery are reduced and, thus, power noise in the signal and I/O paths is reduced.

FIGS. 3A-3G depict an example of a power delivery system implementation in accordance with an illustrative embodiment. In the illustrative embodiment shown in FIG. 3A, laminated power plane 300 is formed by laminating a plurality of conductors 302 between a plurality of insulating material 304. Depending on the required voltages of the processing units/processing cores of the high-performance high-power processor layer, one or more of conductors 302 may supply one voltage, while another one or more of conductors 302 supply a different voltage, such as 1.00 volt, 1.10 volts, 1.20 volts, or the like, while another one or more of conductors 302 may supply grounding potential. In order that the supplied voltage may be transferred to a first plurality of C4 solder balls and then to the high-performance high-power processor layer, each plane of conductor 302 is solid at points 322 where through laminate vias (TLVs) will be coupled to the conductor plane while areas 324 where the plane will be penetrated but not coupled to have openings that will provide an insulating gap between a TLV and the conductor.

FIG. 3B depicts one illustration of the formation of a laminated power plane in accordance with an illustrative embodiment. As discussed above, laminated power plane 300 is formed by laminating a plurality of conductors 302 between a plurality of insulating material 304. In FIG. 3B, a first insulating layer 304a which is solid in composition is the basis for laminated power plane 300, on top of the first insulating layer 304a, is a first conducting layer 302a, which is solid in areas where connecting TLVs will be formed and open in areas where through TLVs will be formed. On top of first conducting layer 302a is a second insulating layer 304b which is solid in form. On top of the second insulating layer 304b, is second conducting layer 302b, which is solid in areas where connecting TLVs will be formed and open in areas where through TLVs will be formed. The process of forming laminated power plane 300 continues until a final conducting layer 302n is layered on top of a final conducting layer 304n. After laminated power plane is formed, the various TLVs are formed such that each TLV couples to a specified one of the plurality of conductors 302 while being insulated from other ones of the plurality of conductors 302.

Figure 3F:
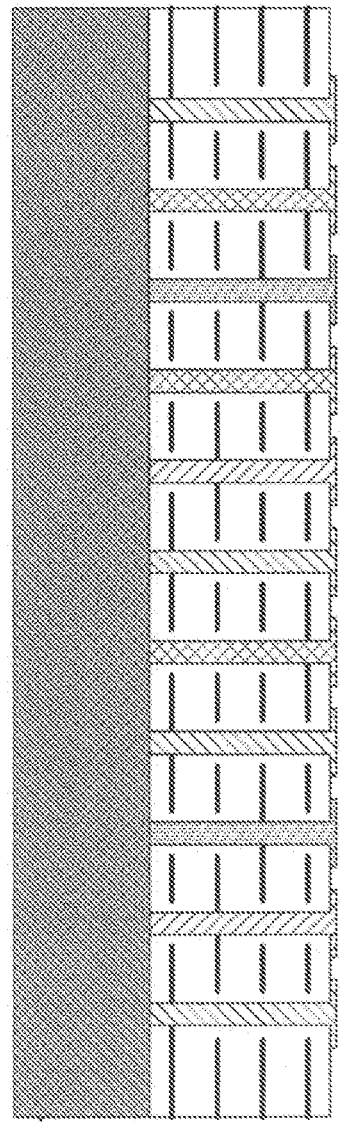
Figure 3G:
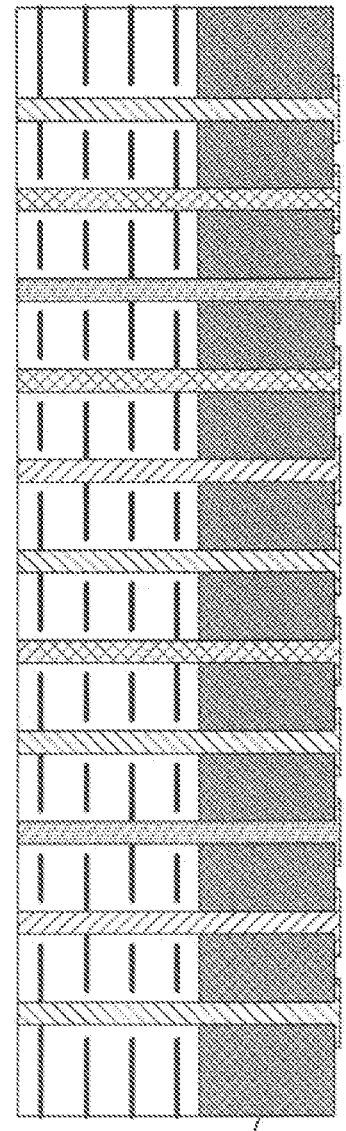

FIGS. 3C-3G depicts alternative methods for the formation of a laminated power plane in accordance with an illustrative embodiment. As discussed above, laminated power plane 300 is formed by laminating a plurality of conductors 302 between a plurality of insulating material 304. In FIG. 3C, in formation of laminated power plane 300, an additional non-electrically conductive organic laminate layer 310 may be inserted to provide mechanical stability to laminated power plane 300 and to reduce the effective thermal expansion coefficient of the thermal power laminate. In FIG. 3D, the plurality of insulating material 304 may be polyimide material 312, which are organic materials with an attractive combination of characteristics, such as low relative permitivity (low k), good thermal stability, chemical inertness, and good adhesion to semiconductors and metals. In FIG. 3E, the plurality of insulating material 304 may be a low temperature co-fired ceramic (LTCC) material 314 that reduces thermal resistance compared to organic materials. In FIG. 3F, laminated power plane 300 may have an additional thermal conductive silicon layer 316 formed on top of laminated power plane 300 to increase thermal conductivity and remove heat from the 3D stack. In FIG. 3G, laminated power plane 300 may have an additional thermal conductive silicon layer 318 formed below laminated power plane 300 to increase thermal conductivity and remove heat from the 3D stack; however, this example requires additional length be added to the TLVs.

Figure 4:
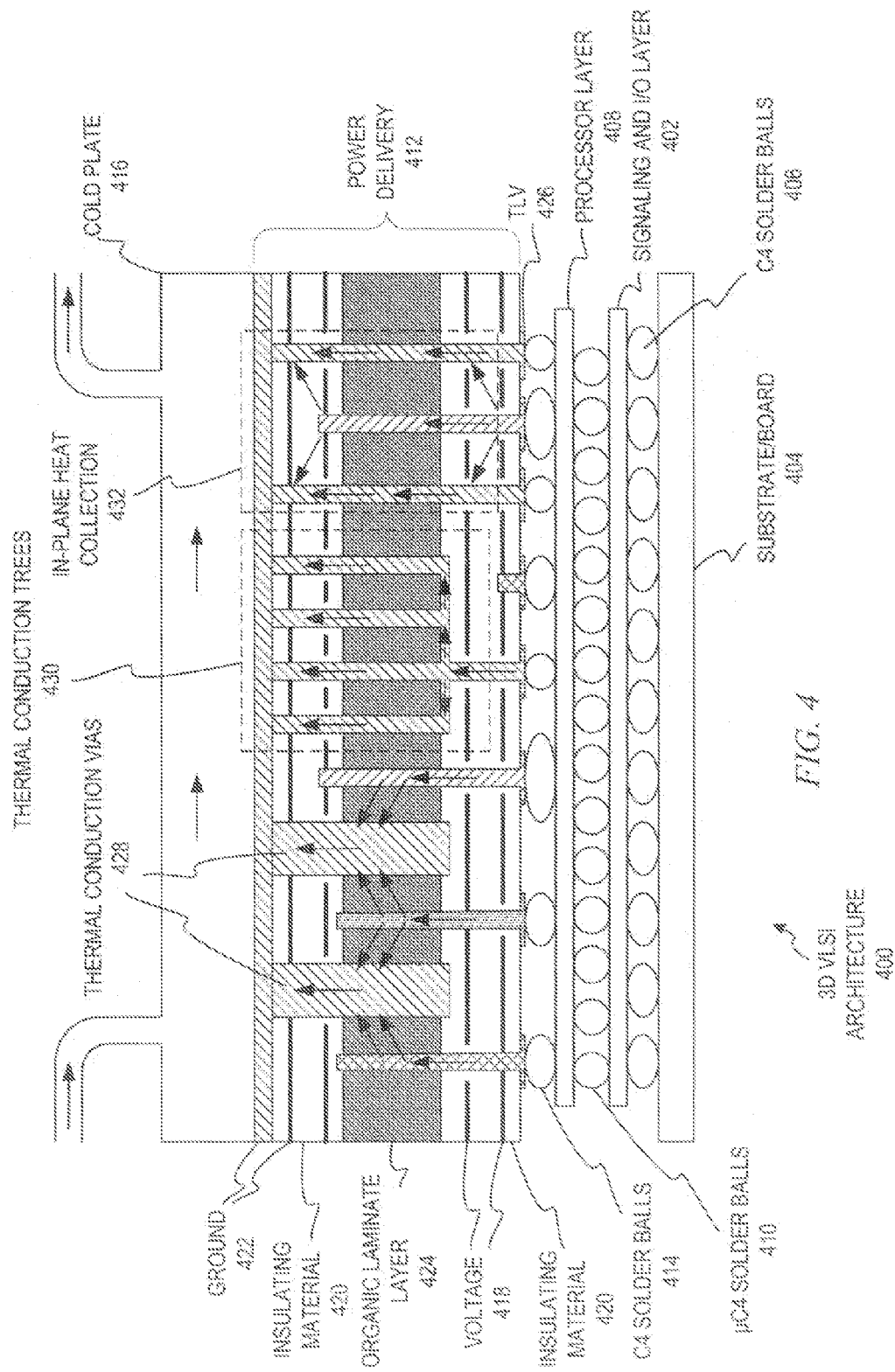
FIG. 4 depicts a 3D VLSI architecture comprising a high-speed signaling and I/O layer coupled to a substrate/board via a second plurality of C4 solder balls in accordance with an illustrative embodiment.

In addition to providing power to a first plurality of C4 solder balls and then to a high-performance high-power processor layer, a laminated power plane, such as that shown in FIGS. 3A-3G may also be configured to optimize thermal dissipation away from the high-performance high-power processor layer. In FIG. 4, 3D VLSI architecture 400 comprises high-speed signaling and I/O layer 402 coupled to substrate/board 404 via a second plurality of C4 solder balls 406 in accordance with an illustrative embodiment. High-performance high-power processor layer 408 is coupled to high-speed signaling and I/O layer 402 via through silicon via (TSV)/micro C4 (μC4) layer 410. Further, power is delivered to high-performance high-power processor layer 408 from power delivery system 412 via a first plurality of C4 solder balls 414 and heat is removed from the 3D stack by cold plate 416 coupled to power delivery system 412.

Power delivery system 412 may be formed in any one of the methods discussed in FIGS. 4A-4G. In the depicted example, power delivery system 412 is a laminate structure comprising a plurality of conductors 418 between a plurality of insulating material 420, one or more ground planes 422, and an additional non-electrically conductive organic laminate layer 424, with TLVs 426 connecting the first plurality of C4 solder balls 414 to one of the plurality of conductors 418 or one or more ground planes 422. Additionally, in order to optimize thermal dissipation away from high-performance high-power processor layer 408, 3D VLSI architecture 400 may also include thermal conduction vias 428 for thermal transfer of heat though sidewalls from TLVs 426 that are directly coupled to the high-performance high-power processor layer 408 to the thermal conduction vias 428 that are coupled to ground planes 422 which is coupled to cold plate 416. The thermal transfer of heat to ground planes 422 at sidewalls reduces heat flux by surface enlargement at low thermal conductivity interfaces for minimal temperature gradient. The arrows within power delivery system 412 indicate heat flow. 3D VLSI architecture 400 may also include ground thermal conduction trees 430 for thermal transfer of heat mainly through ground vias, which also take space above other via locations. 3D VLSI architecture 400 may also include in-plane heat collection 432 that reduces heat flux by surface enlargement at low thermal conductivity interfaces.

Thus, an anisotropic thermal conductive power plane is provided with high thermal conductivity normal to chip backside. The conductive power plane may be sandwiched between chip/stack and a cold plate in order to enable double side electrical access. The thermal coupling of the thermal power laminate to a cold plate may be performed in general with thermal interface materials (typically particle filled polymers), such as thermal grease, thermal adhesive, thermal pads, or by soldering or fusion bonding.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A three-dimensional very-large-scale integration (VLSI) device, comprising;
    a processor layer coupled, via a first set coupling devices, to at least one signaling and input/output (I/O) layer; and
    a power delivery layer coupled, via a second set of coupling devices, to the processor layer, wherein:
        the power delivery layer is dedicated to only delivering power and does not provide data communication signals to the elements of the three-dimensional VLSI device,
        the power delivery layer comprises a plurality of conductors, a plurality of insulating materials, one or more ground planes, and a plurality of through laminate vias (TLVs),
        each TLV in the plurality of TLVs is coupled to one of the plurality of conductors or the one or more ground planes while not being coupled to other ones of the plurality of TLVs, and
        the at least one signaling and input/output(I/O) layer is dedicated to only transmitting the data communication signals to and receiving the data communications signals from the processor layer and does not provide power to the elements of the processor layer.

2. The three-dimensional VLSI device of claim 1, wherein the power delivery layer further comprises an additional non-electrically conductive organic laminate layer that provides stability to the power delivery layer.

3. The three-dimensional VLSI device of claim 1, further comprising:
    a cold plate coupled to the power delivery layer to remove heat from the three-dimensional VLSI device.

4. The three-dimensional VLSI device of claim 1, wherein the power delivery layer further comprises at least one of thermal conduction vias, thermal conduction trees, or in-plane heat collection, for thermal transfer of heat though the plurality of insulating materials from the plurality of TLVs.

5. The three-dimensional VLSI device of claim 4, wherein the thermal conduction vias are coupled to a ground plane in the plurality of ground planes, and wherein the ground plane is directly coupled to a cold plate.

6. The three-dimensional VLSI device of claim 1, wherein the plurality of insulating materials is at least one of a polyimide material or a low temperature co-fired ceramic (LTCC) material.

7. The three-dimensional VLSI device of claim 3, wherein an additional thermal conductive silicon layer is formed between the power delivery layer and the cold plate.

8. The three-dimensional VLSI device of claim 1, wherein an additional thermal conductive silicon layer is formed between the power delivery layer and the processor layer and wherein the plurality of TLVs pass through the additional thermal conductive silicon layer in order to couple in the processor layer.

9. An data processing system, comprising:
a processor layer coupled, via a first set of coupling devices, to at least one signaling and input/output (I/O) layer; and
a power delivery layer coupled, via a second set of coupling devices, to the processor layer, wherein:
the power delivery layer is dedicated to only delivering power and does not provide data communication signals to the elements of the three-dimensional VLSI device,
the power delivery layer comprises a plurality of conductors, a plurality of insulating materials, one or more ground planes, and a plurality of through laminate vias (TLVs),
each TLV in the plurality of TLVs is coupled to one of the plurality of conductors or the one or more ground planes while not being coupled to other ones of the plurality of TLVs, and
the at least one signaling and input/output (I/O) layer is dedicated to only transmitting the data communication signals to and receiving the data communications signals from the processor layer and does not provide power to the elements of the processor layer.

10. The data processing system of claim 9, wherein the power delivery layer further comprises an additional non-electrically conductive organic laminate layer that provides stability to the power delivery layer.

11. The data processing system of claim 9, further comprising:
a cold plate coupled to the power delivery layer to remove heat from the three-dimensional VLSI device.

12. The data processing system of claim 9, wherein the power delivery layer further comprises at least one of thermal conduction vias, thermal conduction trees, or in-plane heat collection, for thermal transfer of heat though the plurality of insulating materials from the plurality of TLVs.

13. The data processing system of claim 12, wherein the thermal conduction vias are coupled to a ground plane in the plurality of ground planes, and wherein the ground plane is directly coupled to a cold plate.

14. The data processing system of claim 9 wherein the plurality of insulating materials is at least one of a polyimide material or a low temperature co-fired ceramic (LTCC) material.

15. The data processing system of claim 11, wherein an additional thermal conductive silicon layer is formed between the power delivery layer and the cold plate.

16. The data processing system of claim 9 wherein an additional thermal conductive silicon layer is formed between the power delivery layer and the processor layer and wherein the plurality of TLVs pass through the additional thermal conductive silicon layer in order to couple to the processor layer.

17. A method, in a data processing system, for a thermal power plane that delivers power to integrated circuits and constitutes a minimal thermal resistance in a three-dimensional very-large-scale integration (VLSI) device, the method comprising:
coupling a processor layer to at least one signaling and input/output (I/O) layer using a first set of coupling devices; and
coupling a power delivery layer to the processor layer using a second set of coupling devices, wherein:
the power delivery layer is dedicated to only delivering power and does not provide data communication signals to the elements of the three-dimensional VLSI device,
the power delivery layer comprises a plurality of conductors, a plurality of insulating materials, one or more ground planes, and a plurality of through laminate vias (TLVs),
each TLV in the plurality of TLVs is coupled to one of the plurality of conductors or the one or more ground planes while not being coupled to other ones of the plurality of TLVs, and
the at least one signaling and input/output (I/O) layer is dedicated to only transmitting the data communication signals to and receiving the data communications signals from the processor layer and does not provide power to the elements of the processor layer.

18. The method of claim 17, wherein the power delivery layer further comprises an additional non-electrically conductive organic laminate layer that provides stability to the power delivery layer.

19. The method of claim 17, further comprising:
coupling a cold plate to the power delivery layer to remove heat from the three-dimensional VLSI device.

20. The method of claim 17, wherein the power delivery layer further comprises at least one of thermal conduction vias, thermal conduction trees, or in-plane heat collection, for thermal transfer of heat though the plurality of insulating materials from the plurality of TLVs.

21. The method of claim 20, wherein the thermal conduction vias are coupled to a ground plane in the plurality of ground planes, and wherein the ground plane is directly coupled to a cold plate.

22. The method of claim 17, wherein the plurality of insulating materials is at least one of a polyimide material or a low temperature co-fired ceramic (LTCC) material.

23. The method of claim 19, wherein an additional thermal conductive silicon layer is formed between the power delivery layer and the cold plate.

24. The method of claim 17, wherein an additional thermal conductive silicon layer is formed between the power delivery layer and the processor layer and wherein the plurality of TLVs pass through the additional thermal conductive silicon layer in order to couple to the processor layer.

* * * * *